United States Patent [19]

Nishikawa et al.

[11] Patent Number: 4,478,098

[45] Date of Patent: Oct. 23, 1984

[54] PUSHBUTTON TUNER

[75] Inventors: Yasuhisa Nishikawa; Yoshio Tanaka; Ryoichi Hasumi, all of Saitama; Takashi Koizumi, Toda, all of Japan

[73] Assignee: Clarion Co., Ltd., Tokyo, Japan

[21] Appl. No.: 243,639

[22] Filed: Mar. 13, 1981

[51] Int. Cl.³ .......................... H03J 1/00; H03J 5/12; F16D 27/10

[52] U.S. Cl. .................. 74/10.33; 74/10.8; 116/241; 192/65; 192/84 T; 192/89 B; 192/90

[58] Field of Search .............. 74/10.33, 10.37, 10.8; 334/7; 116/241; 192/65, 76, 89 B, 84 C, 84 T, 90

[56] References Cited

U.S. PATENT DOCUMENTS

| | | | |
|---|---|---|---|
| 1,288,270 | 12/1918 | Stuart | 192/90 |
| 3,129,798 | 4/1964 | Rabinou | 192/84 T |
| 4,030,052 | 6/1977 | Pelletier | 74/10.33 X |
| 4,267,739 | 5/1981 | Nishikawa | 74/10.33 |
| 4,348,911 | 9/1982 | Tanaka et al. | 74/10.33 |

Primary Examiner—Allan D. Hermann
Attorney, Agent, or Firm—Wallenstein, Wagner, Hattis, Strampel & Aubel, Ltd.

[57] ABSTRACT

A pushbutton tuner formed of a base unit (A) including a memory slide and operating members for displacing the memory slide upon operation of a push button; a coil unit (B) including a movable member provided with cores displaceable relative to coils; a clutch unit (C) including a clutch mechanism and provided with a rotating shaft for manual tuning operation; and an arm unit (D) including a plurality of button slides fitted with push buttons, respectively, and slidably disposed on a top plate. These units are assembled separately from each other and, then, mounted on a baseplate of the base unit (A).

10 Claims, 12 Drawing Figures

PUSHBUTTON TUNER

BACKGROUND OF THE INVENTION

1. Field of the Invention

This invention relates to a pushbutton tuner, and more particularly to a pushbutton tuner which is composed of mechanism units (subassemblies) and therefore capable of enhancing production rates, adapting itself for various designs of pushbutton tuners and allowing replacement by a unit.

2. Description of the Prior Art

In general, a conventional pushbutton tuner is assembled in such a manner that components are mounted sequentially on a base member such as a chassis. This is disadvantageous in that the number of assembling steps are very large, and the entire design arrangement must be changed if any one of the components is changed. Also, replacement of a broken or damaged components is extremely difficult. In addition, it is difficult to automate the assembling procedures of the conventional pushbutton tuner.

OBJECT OF THE INVENTION

It is therefore an object of the present invention to provide a pushbutton tuner which is capable of obviating the disadvantages involved in the conventional pushbutton tuner.

It is another, more specific object of the present invention to provide a pushbutton tuner which is composed of mechanism units such as a base unit, arm unit, clutch unit and a coil unit, allowing assembling and production by units and allowing modification of the tuner according to demands by the users.

SUMMARY OF THE INVENTION

In accordance with the present invention, there is provided a pushbutton tuner comprising:

a base unit including a baseplate, a plurality of operating members each pivotally supported on the baseplate, and memory slide disposed over the baseplate so as to be displaced by the operating members;

a coil unit including a plurality of tuning coils, a plurality of cores provided in relation to the corresponding tuning coils, respectively, and a moving member responsive to the displacement of the memory slide for inserting and drawing the cores into and out of the corresponding coils, said coil unit being fitted to said baseplate of the base unit;

an arm unit including a top plate, a plurality of button slides each having a push button fitted thereto, respectively, and disposed on the top plate, and a frequency control member provided on each of the button slides and adapted to act on the operating member upon depression of the push button; and a clutch unit wherein a manual rotating shaft is provided, and the rotation of the rotating shaft is conveyed to the memory slide through the clutch mechanism and the clutch mechanism is opened upon depression of the button slide;

said arm unit and said clutch unit being arranged on the baseplate of the base unit.

BRIEF DESCRIPTION OF THE DRAWINGS

FIG. 2 is a plan view of the pushbutton tuner illustrated in FIG. 1, showing it in the assembled state;

FIG. 3 is a side elevational view of the pushbutton tuner illustrated in FIG. 1;

DESCRIPTION OF THE EMBODIMENT

Figure 1:
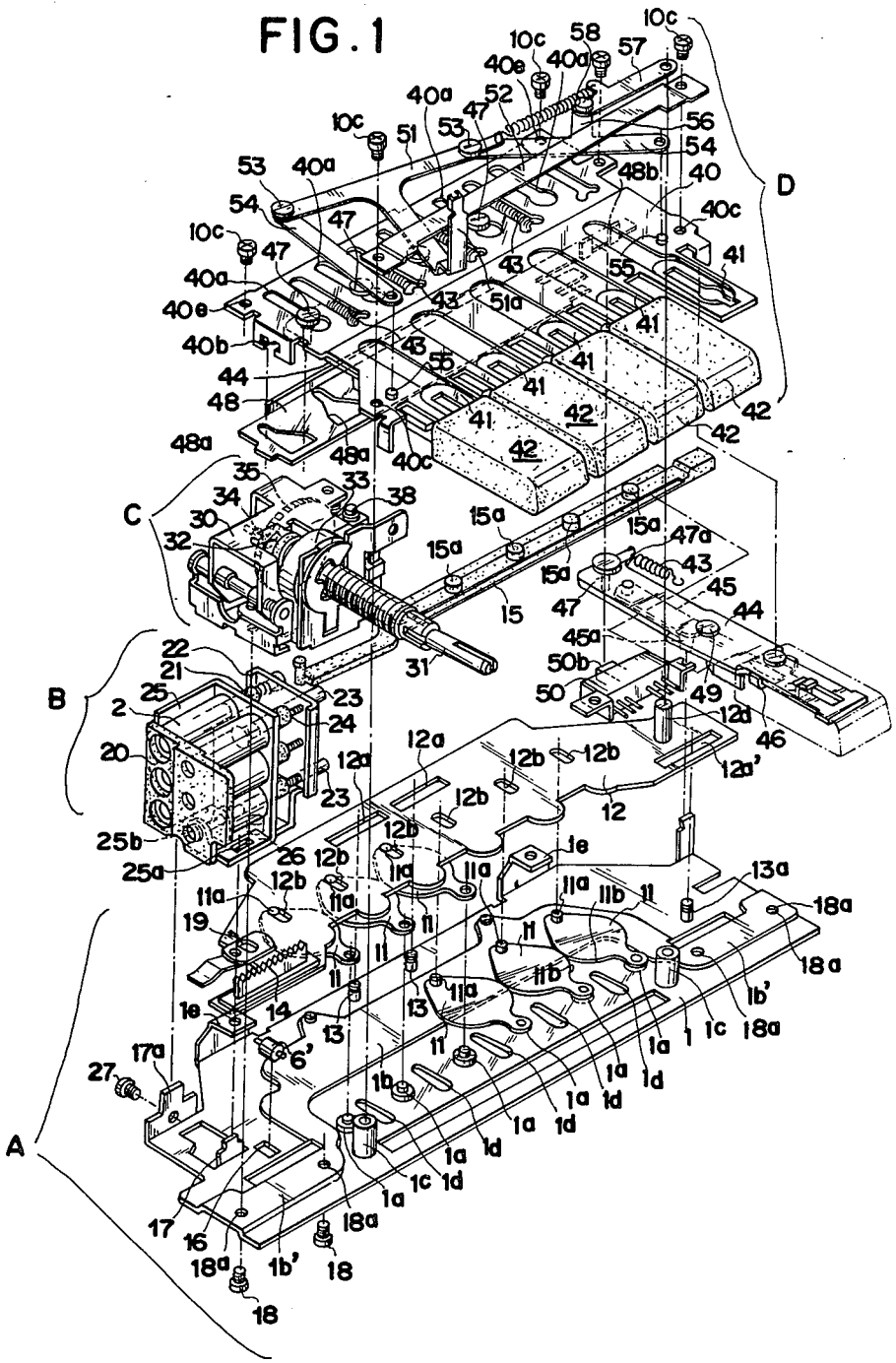
FIG. 1 is an exploded perspective view of a pushbutton tuner in accordance with the present invention.
Figures 2, 3:
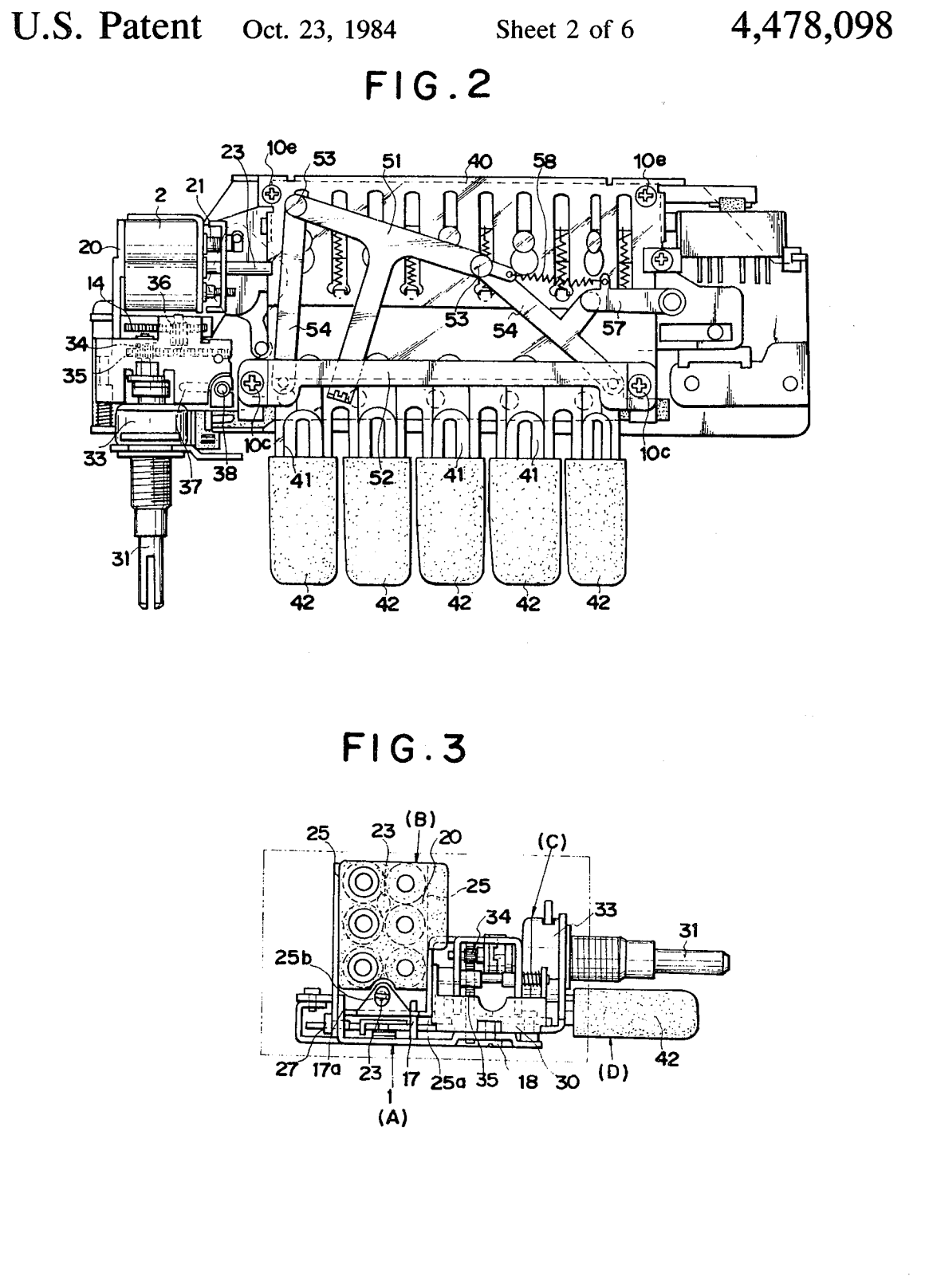

A pushbutton tuner which is assembled as illustrated in FIGS. 2 and 3 is comprised of a base unit A, a coil unit B, a clutch unit C and an arm unit D. In the base unit A, a plurality of leaf-shaped operating members 11 are arranged on a baseplate 1 having a raised portion 1b. More specifically, the operating members 11 are each supported at respective base ends thereof by projections 1a provided at a forward portion of the baseplate 1, respectively, and the respective tip ends thereof are disposed on the raised portion 1b. A memory slide 12 is laid on at least tip end portions of the operating members. This memory slide 12 is engaged with the baseplate 1 through guide pins 13 provided at rear portions of the baseplate 1 and elongated slots 12a of the memory slide 12. Each of the operating members 11 further has a pin 11a provided at the respective tip end portion and an engaged with elongated slot 12b which extends perpendicularly to the elongated slot 12a. The memory slide 12 has at a sideward portion thereof a rack member 14 which is in mesh with the clutch unit C. To fit the rack member 14, there are provided laterally extending slots 12a' on opposite sides of the memory slide 12 as shown on the right side viewed in FIG. 1. The rack member 14 is fitted in the slot 12a'. One of the slots 12a' in which the rack member 14 is not fitted is engaged with a guide pin 13a. However, it is not essential that the guide pin 13a be fitted in the slot. The baseplate 1 further has, at a sidward portion, a roller-receiving opening 16 in which a roller 6' is fitted. A top portion of the roller 6' abuts against a bottom face of the rack member 14. A member 15 provided with kick points 15a is slidably fitted in guide slots 1e formed at rear portions of the baseplate 1. E rings are secured to the upper ends of the guide pins 13, 13 and 13a to assemble the components into the base unit A.

The coil unit B is comprised of coils 2 disposed between a terminal plate 20 and a frame plate 25 and cores 21 disposed on a movable plate 22 which is attached to the frame plate 25 and adapted to allow the cores 21 to be inserted into and withdrawn from the coils 2. As apparent from FIG. 1 in view of FIG. 3, the bottom face of the frame plate 25 has mounting seats 25b and 25b and guide rods 23 and 23 are provided between the terminal plate 20 and the cores 2 and inserted in openings 24 formed on the movable plate 22 so as to guide a sliding operation of the movable plate 22. The so constructed coil unit B is fitted to the base unit A in such a manner that an engaging slot 25a on the frame plate 25 is engaged with an upstanding portion 17 of the baseplate 1 and a rear lower portion of the frame member 25 is clamped by a screw 27 inserted through another upstanding portion 17a of the baseplate 1. In addition, an engaging member 26 projecting downwardly from the lower face of the movable plate 22 engages with a slot 19 formed at a sideward portion of the memory slide 12, so that the movable plate 22 is slidable upon displacement of the memory slide 12 to insert or draw the cores 21 into or out of the respective coils 2.

In the clutch unit C (See also FIG. 4), a rotating shaft 31 and a volume-control member 33 are provided on a frame member 30. A pinion 34 and a gear 35 are driven by the rotating shaft 31 through a universal joint 32 and a small gear 36 rotatable through the pinion 34 and the gear 35 is engaged with the rack member 14. A clutch mechanism of the clutch unit C is switched by a clutch lever 37 supported on pin 39 so as to be operated by a pushbutton operation, as will be described in detail later, through a kick arm 15. The clutch unit C is fixed to the baseplate 1 by means of slots 18a, 18a and screws 18 fitted therein, respectively, as illustrated in FIG. 3.

The arm unit D is formed using a top plate 40 as a base. More specifically, the top plate 40 has guide portions 41 extending forwardly as illustrated in FIG. 1 for guiding depressing operations of the push buttons 42. Each of the push buttons 42 is fitted to a button slide 44 as explodedly illustrated at a middle, rightward portion in FIG. 1. The button slide 44 is disposed in parallel with the top plate 40 and a tension spring 43 is provided because the top plate 40 and the respective button slide 44. Each button slide 44 is provided with a frequency determining member 45, which is adapted to be adjustable with respect to its set position by a control member 46. A pin 45a of the frequency determining member 45 is adapted to engage with a curved shoulder portion 11b of the operating member 11 and to tilt either one of the adjacent two operating members 11, 11 for displacing the memory slide 12. A pin 47 provided at a rear end portion of the button slide 44 is received in a cam slot 48a formed on a changeover plate 48 attached to a rear lower portion of the top plate 40. In response to the pushing operation of the button slide 44, the changeover plate 48 is displaced to operate a switch 50 whose projection 50b is held between operating portions 48b of the changeover plate 48. The pin 47 has a stepped head 47a which engages with a slot 40a formed at a rearward portion of the top plate 40, and a lower end of a pin 49 for fixing the control member 46 at an intermediate portion of the button slide 44 engages with a guide slot 1d formed on the baseplate 1 between the respective operating members 11, so that the button slide 44 is guided accurately in the direction of depression. The changeover plate 48 is assembled by fitting the changeover plate 48 to guide portions 40b at side portions of the top plate 40 so as to be slidable relative to the top plate 40. A dial pointer mechanism 51 is provided over the top plate 40. The arm unit D is fixed to the base unit A by screws 10c and 10e which are respectively fitted through holes 40c, 40c formed at forward side portions of the top plate 40 and holes 40e, 40e formed at rear side portions thereof and threadedly engaged with bosses 1c, 1c of the baseplate 1 and fitting seats 1e, 1e thereof.

Figure 9:
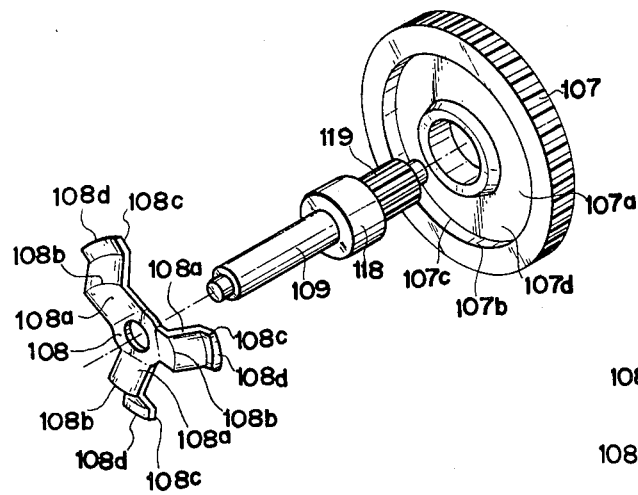
FIG. 9 is an exploded perspective view of a clutch member and a clutch gear.

The dial pointer mechanism 51 is comprised of a T-shaped member arranged centrally and control rods 54, 54 which are pivotally connected at 53, 53, to opposite ends of the T-shaped member, respectively. Other ends of the control rods are pivotally fitted to projections 55 formed on the top plate 40, respectively. One of the control rods 54 has a projecting portion 56 at an intermediate position between the ends thereof which portion 56 is pivotally connected to one end of another interlocking link member 57. Another end of the interlocking link member 57 is pivotally fitted to an engaging portion 12d of the memory slide 12. Thus, a dial pointer portion 51a can effect a linear movement according to Roberts' approximation with a structure of short depth. Undesired play as will be caused at the respective connecting portions is absorbed by a spring 58 provided between the interlocking link 57 and the T-shaped member as illustrated in FIG. 9.

In accordance with the present invention as described above, a desired pushbutton tuner can be obtained by assembling the base unit A, the coil unit B, the clutch unit C and the arm unit D as described above or making desired adjustments therefor. This unit-subassembly system can simplify assembly procedures as compared with a system in which all the components are assembled sequentially on a baseplate, or on a chassis used as a base. In addition, since adjustment can be made for each unit, a complicated adjusting operation which is required in the conventional system can be avoided. In the conventional system, adjustment must be made at a time of assembling of the respective components. Furthermore, each unit can be preliminarily manufactured with advantage so as to rapidly and easily cope with future large demand. Moreover, by providing fitting seats 1b' each having fitting holes 18a at opposite positions of the baseplate 1, the clutch unit C may be located on the left side or on the right side according to necessity. Further, the coil unit B may have another structure, i.e., a two-decker structure wherein three coils are arranged in each deck instead of the three-decker structure as illustrated in FIG. 1 wherein two coils are arranged in each of the three decks, to reduce the height of the coil unit. These changes may be made freely even after completion of assembling. When there is caused a partial damage or trouble, it will suffice to replace only the unit involving the damage or trouble, to economically recover the desired function.

A preferred form of the pushbutton tuner in accordance with the present invention may include an improved clutch mechanism, as will next be discussed.

As widely known, a clutch mechanism is ordinarily employed in a pushbutton tuner for allowing switching from a normally operative fine tuning operation system using a manual rotating shaft to a one-touch tuning operation system using a push button when the push button is actuated. In a general conventional clutch mechanism, however, it is not easy to prevent backlash between gears and assure desired clutch operation. On the other hand, a conventional clutch mechanism which is specially adapted to attain a desired clutch operation has another disadvantage such that the memory slide cannot always attain smooth sliding movement.

To improve the disadvantages of the conventional clutch mechanisms, the improved clutch mechanism of the present invention employs a roller at an engaging portion between the memory slide and the gears of the clutch mechanism. In addition, an appropriate resilient force is applied to the roller to eliminate backlash and attains desired meshing for assuring a smooth operation.

Figure 4:
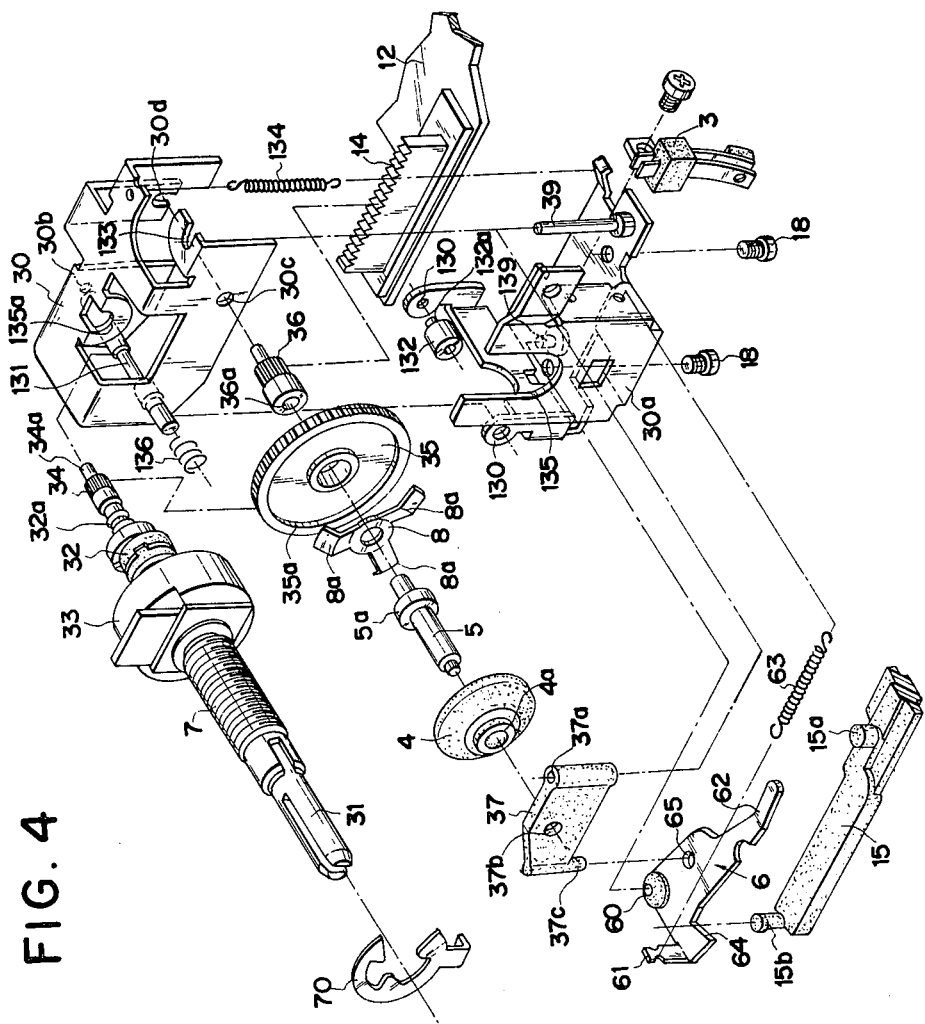
FIG. 4 is an exploded perspective view of components of a clutch mechanism of the pushbutton tuner illustrated in FIG. 1.
Figure 5:
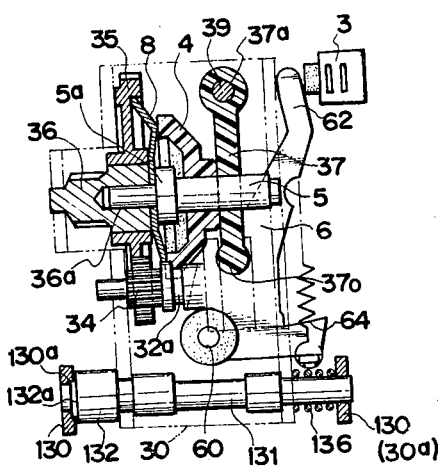
FIG. 5 is a sectional view of the clutch mechanism ilustrated in FIG. 4, showing it in the assembled state.

The concrete and specific structure of the clutch unit C is as illustrated in FIGS. 4 and 5. The frame member 30 is assembled with a base frame 30a which is fixed to the base plate 1 by the screw 18. More specifically, a shaft 131 is provided on the frame member 30 so as to project at the opposite ends thereof. One end of the shaft 131 is fitted through a spring 136 in one of support portions 130 formed at sideward portions of the base frame 30a. Another end of the shaft 131 is fitted in a bush 132 outside of the base frame 30. The bush 132 has a tapered portion 132a which is fitted in a holes 130a of another support portion 130 as can be seen from FIG. 5. The tapered portion 132a of the bush 132 on the shaft 131 is pressed against the hole 130a of the action of the spring 136 so that the shaft 131 is supported by the hole 130a without leaving a gap therebetween and in an effectively centered state.

The base frame 30a further has an engaging shaft 39 provided at another sideward portion thereof. The shaft 39 engages with an abutment member 133 formed at another sideward portion of the frame member 30. Between the frame member 30 and the base frame 30a is provided a tension spring 134. The base frame 30a further has a support portion 135 for supporting a base portion of a threaded cylinder 7 fitted around the rotating shaft 31. The threaded cylinder is fixed by an E-ring 70. The universal joint 32 has at one end portion thereof a diameter-reduced portion 32a which is supported by a support portion 135a formed at a central portion of the frame member 30. A shaft portion 34a extending from a pinion 34 formed at a tip end portion of the rotating shaft 31 is fitted in a hole 30b of the frame member 30. The clutch mechanism member is fitted between another hole 30c of the frame member 30 and a support portion 30d thereof. This clutch mechanism as illustrated includes a thrust collar 4, a resilient member 8 and a clutch lever 37 as well as the gears 35 and 36. These members are mounted on the clutch shaft 5. On one side of a flange 5a of the clutch shaft 5, the gear 35, the resilient member 8 and the small gear 36 are assembled, and on another side of the flange 5a, the thrust collar 4 and the clutch lever 37 are provided as illustrated in FIG. 5. The clutch lever 37 is rotatably supported at the end 37a thereof by the engaging shaft 39 as described above and has, at a free end thereof, a projection 37c which is fitted in an engaging opening 65 of the operating lever 6. The operating lever 6 has, at a corner portion thereof, a shaft support portion 60 which is pivotally supported by a shaft portion 139 of the base frame 30a. A receiving member 64 formed on the operating lever 6 is adapted to abut against a projection 15b of the kick lever 15. A spring 63 is provided between a seat 61 and the base frame 30a for urging the receiving portion 64 so as to follow the projection 15b of the kick lever 15. The operating lever 6 further has an arm portion 62 for operating a muting switch 3. More specifically, while the resilient member 8 is normally pressed by the action of the kick lever 15 as illustrated in FIG. 5 to convey the rotation of the gear 35 to the small gear 36 through the resilient member 8 to effect bodily rotation thereof, the kick arm 15 is displaced through the action of an engaging portion 46b of the button slide 44 on the projection 15a of the kick arm 15 upon depression of the button slide 44. As a result, the operating lever 6 is rotated around 60 to operate the clutch lever 37 for releasing the pressure against the resilient member 8. Thus, the clutch is switched from an interlocking condition with the gear 35.

Although the resilient member 8 has three divided end portions in the embodiment as illustrated, it is apparent that the member 8 may have four or more end portions. When the member 8 is made of a metallic material, the clutch switching operation can be attained sharply and accurately. The resilient member 8 is mounted so as to abut against a stepped portion 35a of the gear 35 as illustrated in FIG. 5 and bent end portions 8a are pressed by the periphery of the clutch disc 4. Thus, a smooth switching operation can be attained by such a small clutch mechanism, and a temperature influence on the clutch operation can be substantially eliminated by forming the member 8 of a metallic material.

In the clutch mechanism in accordance with the present invention, the memory slide is disposed on the baseplate supported by the roller 6' and engaged with the small gear 36 of the clutch mechanism through the rack member 14 of the memory slide, and the clutch mechanism having the small gear 36 is mounted on the frame member 30. The frame member 30 is pivotally supported at one end thereof relative to the baseplate 1 and the spring 134 is provided at the free end of the frame member 30 to urge the frame member 30 towards the baseplate 1. With this arrangement, possible backlash due to undesired bending of the memory slide or deviation in the rack member from the design tolerances can be effectively eliminated and proper interlocking relation can be assured.

Further in accordance with the embodiment of the present invention as described above, the clutch mechanism is comprised of the base frame and the frame members, and the principal interlocking members comprising the clutch mechanism, such as the main gear 35, the small gear 36 and the pinion 34, are all mounted on the frame member 30 which is movably assembled with the base frame 30a. In addition, the spring is provided between the frame member 30 and the base frame 30a fixed to the baseplate 1. Therefore, the backlash between the memory slide 12 and the rack member 14 can be effectively prevented and a stable interlocking relation can be attained.

Furthermore, since the pivotal connection between the frame member 30 and the base frame 30a is attained in such a manner that one end of the pivotal shaft 131 is supported in the opening 130a by the tapered portion 132a and the other end is fitted with the spring 136, so that the frame member can be surely connected to the base frame without a gap to assure accurate and smooth interlocking relation.

FIGS. 6 to 12 illustrate a further improved clutch mechanism suitably employable for the pushbutton tuner of the present invention. There is a further problem involved in the conventional clutch mechanism other than those as described in relation with the foregoing embodiment of the clutch mechanism. More particularly, in general, the conventional clutch mechanism is so formed that a pinion provided at a tip end of a manually rotating tuning shaft is engaged with a crown gear which is adapted to be engaged with or disengaged from, through a clutch member, a rotary disc interlocked with a rotating crank for displacing a core slide. The clutch plate and the crown gear are normally pressed against the rotary disc by the action of a coil spring to constitute a system of an operation of a manual rotating tuning shaft. Upon a pushbutton operation, a separately provided kick arm etc. is actuated and the actuation of the kick arm is conveyed to a clutch lever through an appropriate interlocking mechanism to release the urged interlocking relation between the clutch plate and the crown gear. In this formation, however, a bulky member such as rotating crank is required, and the push button is subject to a large operational resistance at the time of depression of the push button because the actuating mechanism should operate the bulky rotating crank and the kick arm together with the core slide. Moreover, the clutch member should be a frictional plate made of a rubber such as a neoprene, and therefore an accurate clutch operation is not always assured and subject to a temperature influence, which will cause a tuning deviation. Such a clutch mechanism is poor in weatherability and abrasion resistance.

To solve this problem, the inventors of the present invention have proposed a clutch mechanism utilizing a contact relation between a clutch sleeve having a conical face and a conical inner face of an annular clutch gear (Japanese Patent Application No. 53-147197 (1978)). This system may be called "collet type system", and by this system, accuracy can be assured for a clutch operation since the system utilizes contacting relation between the complementary conical faces of rigid materials. With this arrangement it becomes unnecessary to dispose the bulky rotating crank over the operation space of all push buttons. A kick arm employable in the system may be formed of a narrow rod-like member slidable in a leftward or rightward direction, and interlocking members may also be simplified or reduced in size. Thus, the entire structure of the pushbutton tuner can be reduced in size. However, it has been found that a considerably large number of cutting steps are needed in the manufacture of the clutch sleeve for forming the conical face on the clutch sleeve, and that grooves should be cut on the conical face of the rigid material to achieve the desired clutch operation. Morever, a structure of a main shaft to be fitted in the clutch sleeve or a structure for mounting a coil spring involves some problems to be solved in the manufacturing and assembling thereof.

Figure 6:
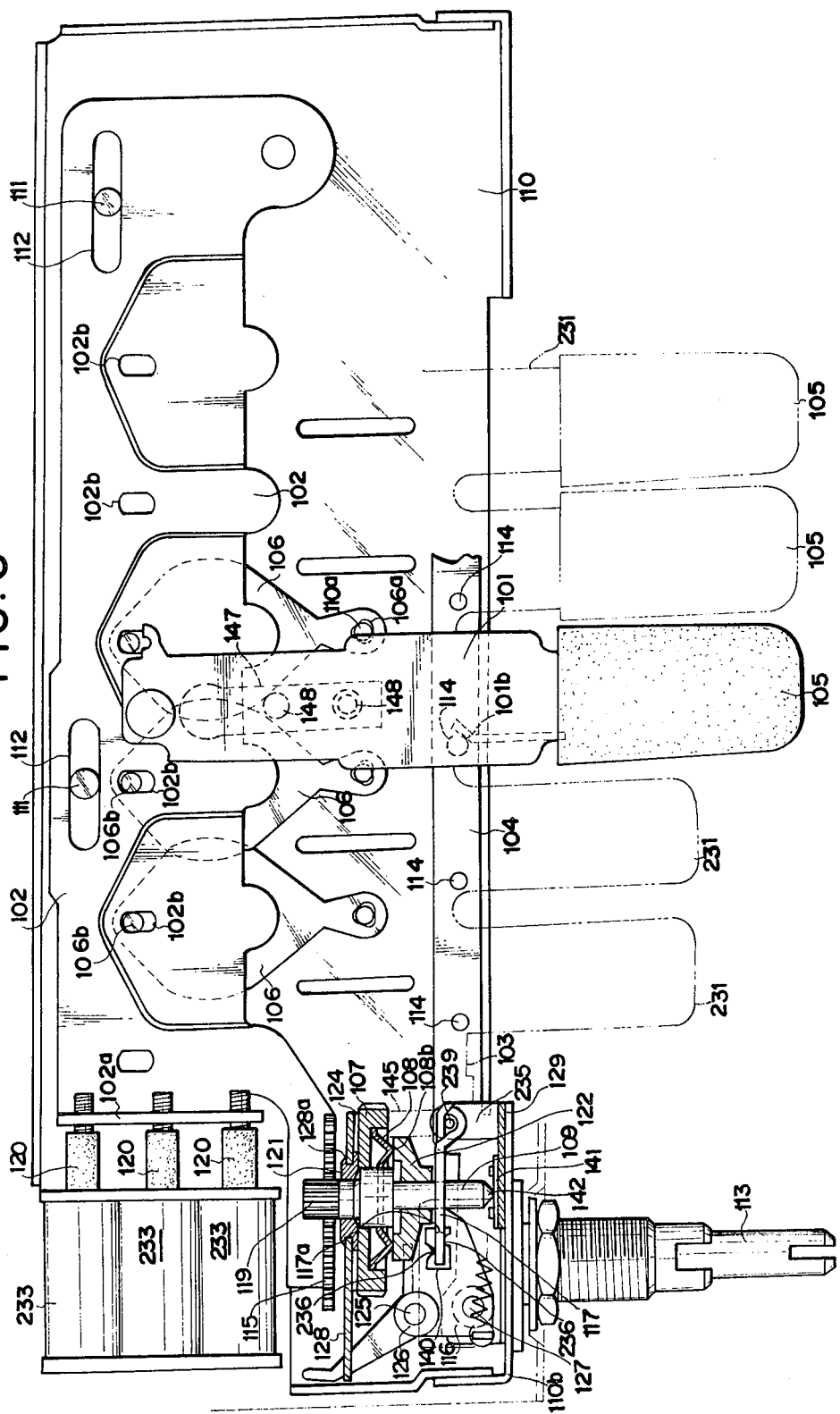
FIG. 6 is a partly cut-away plan view of a pushbutton tuner incorporating another form of clutch mechanism in accordance with the present invention.

The clutch mechanism of the present invention has been made with a view to improvement of these problems. In accordance with the present embodiment, there is provided a clutch mechanism comprising an input shaft and an output shaft, two rotating members assembled coaxially and interlocked with the shafts, respectively; one of the rotating members being formed with a recessed portion having an angular portion, on a side confronting another rotating member; a resilient clutch member having a slanting section and disposed between the rotating members; the clutch member being so disposed that the periphery portion thereof being directed to the angular portion of the recessed portion and being formed with a face contacting the recessed portion; and a switching operation member for pressing said another rotating member against said one of the rotating members to spread the slanting section portion of the resilient clutch member. A preferred embodiment of the present invention is illustrated referring to FIGS. 6 to 12. An entire structure of a pushbutton tuner incorporating the clutch mechanism therein is illustrated in FIG. 6. A plurality of push buttons 105 are arranged along the front of a chassis 110. Each of the push buttons 105 is adapted to be depressed along a guide 231 formed on a top plate 103 fixed over the chassis 110, and fitted to a button slide 101. The button slide 101 is fitted with a setting member 147 having a setting projection 148. Link members 106 are disposed within the operating spaces of the respective setting projections 148 as illustrated in FIG. 6. Each of the link members 106 has a slot 106a which is engaged with a projection 110a of the chassis 110 and has a projection 106b which is engaged with an elongated slot 102b formed on a core slide 102. Upon depression of the button slide 101, the projection 148 acts on a shoulder of the link member 106 to tilt the same so that the core slide 102 is displaced leftwardly or rightwardly while being guided by a guide slot 112 and a pin 111 of the chassis 110. The core slide 102 has a seat portion 102a upstanding at a sideward portion of the core slide 102, on which seat portion 102a are fitted cores 120. The cores 120 are inserted in coils 233 provided on the chassis, respectively. Upon the displacement of the core slide 102, the cores 120 are moved relative to the respective coils 233 to attain the tuning operation. Separately from the tuning operation system by the push button 105, there is provided another tuning operation system by an input shaft, i.e. a manual rotating tuning shaft 113. More specifically, the tuning shaft 113 has, at a tip end thereof, a pinion similar to those employed conventionally. The pinion is in mesh with one of rotating members, i.e., a clutch gear 107. An output shaft, i.e., a main shaft 109 mounted coaxially with the clutch gear 107 has a pinion 119 which is in mesh with a rack 115 formed at a sideward portion of the core slide 102, so that when the tuning shaft 113 is rotated, the core slide is displaced laterally to attain a tuning operation.

Figure 7:
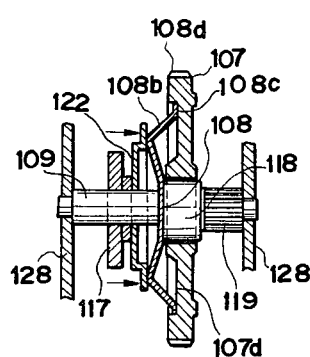
FIG. 7 is a sectional view of a modification of a main portion of the clutch mechanism.

To switch the tuning operation systems by the tuning shaft 113 and the push button 105, the clutch mechanism has a construction as illustrated in FIG. 7. The clutch gear 107 has an annular recessed portion 107d on one face thereof as illustrated in FIG. 9. An angular portion 107c is defined by a bottom portion 107a of the recessed portion 107d and a side portion 107b of the portion 107d. A resilient clutch member 108 is received in the annular recessed portion 107d. More specifically at least peripheral portions of the resilient clutch member 108, which is mounted on the main shaft 109 so as to abut against one side of a flange 118 provided at an intermediate position between its ends, is received in the annular recessed portion 107d. In the embodiment as illustrated, the clutch member 108 has three leg portions 108a formed at intervals of 120° and each of the legs 108a is bent at 108b to provide resiliency. Peripheral edges 108d of the leg portions 108a abut against the angular portion 107c, and contact faces 108c adjacent to the respective peripheral edges 108d are in contact with the bottom of the recessed portion 107a. Another rotating member, thrust collar 122 is further mounted on the main shaft 109 so as to be slidable thereon as illustrated in FIG. 6. The thrust collar 122 has a peripheral portion which is adapted to press against the bent portion 108b of the resilient clutch member 108. In the embodiment of FIG. 6, the main shaft 109 is supported, at one end thereof, by a bush 121 fitted in a slot 128a in a support bracket 128 of the chassis 110 and rotatably supported, at another, needle-pointed end 142, through a bearing metal member 141, by an auxiliary bracket 129 attached to an upstanding portion 110b of the chassis 110 as illustrated in FIG. 6. A clutch lever 117 is also mounted on the main shaft 109 so as to confront the collar 122. The pinion 119 on the main shaft 109 is in mesh with the rack 115. An annular frictional member 124 made of a resilient material such as a rubber and having roughened faces are disposed between the support bracket 128 and the clutch gear 107.

A shaft member 239 is fitted to a base end of the clutch lever 117. An upper end of the shaft member 239 is supported by a bearing portion 145 extending from the support bracket 128, and a lower end of the shaft member 239 is supported by a bearing portion 235 of an auxiliary bracket 129. The clutch lever 117 has, at its free end, a projection 117a extending downwardly. The projection 117a is fitted in an engaging slot 140 formed at a sideward portion of the clutch link 116. Arcuate projections 236 and 236 are formed so as to project into the engaging slot 140 as illustrated in FIG. 6. Since the projection 117a is disposed between the projections 136 and 136, the operation of the link 116 is conveyed to the lever 117. The clutch link 116 has, at another sideward portion thereof, a cylindrical slot portion 126, which is adapted to receive a pin 125 of the support bracket 128 to rotate the clutch link 116 therearound. This rotation is attained also by connecting coupling member 127 of the kick arm 104 to a forward end portion of the clutch link 116. The kick arm 104 is disposed so as to cross the area where the button slides 101 are disposed. The arm 104 is a narrow strip attached to a forward portion of the chassis 110 and has projections 114 at positions corresponding to the respective button slides. The projections 114 are positioned so as to be engageable with respective engaging pins 101b and adapted to be actuated by the engaging pin 101b upon depression of the push button to displace the kick arm 104 leftwardly as viewed in FIG. 6. As a result, the clutch link 116 is rotated clockwise as viewed in FIG. 6 so that the operation direction of the kick arm 104 provided along the face of the chassis 110 is changed over readily and accurately through engagement of the projection 117a of the clutch lever 117 with the engaging slot 140 to operate the clutch lever 117 smoothly. The pressure of the clutch member 108 against the frictional member 124 is released to effect a clutch switching operation.

Figure 8:
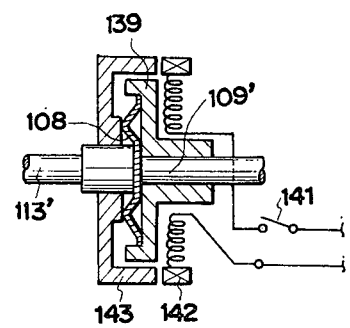
FIG. 8 is a similar sectional view of another modification of the main portion of the clutch mechanism.
Figure 10:
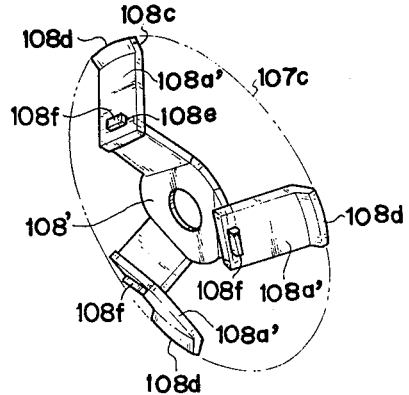
FIG. 10 is a perspective view of a modification of the clutch member.

The collar 122 adapted to be operated by the clutch lever 117 as described above may be formed in a disc shape as illustrated in FIG. 7, and the structure for supporting the main shaft 109 relative to the support bracket 128 may be a simple one as illustrated in FIG. 7. Further alternatively, an input shaft 113' may be assembled coaxially with an output shaft 109' as illustrated in FIG. 8. In the figure, a clutch member 108 is mounted between a disc member 143 having a section similar to that of the clutch gear 107 and fitted on the input shaft 113' and a disc portion of the output shaft 109'. An electromagnetic mechanism 142 is disposed at a position adjacent to the disc member 143 and operated by an on-off operation of a switch 141 in response to depression of the push button. An electromagnetic force generated by the electromagnetic mechanism 142 acts on the disc member 143 to slide the same. The rotating force of the input shaft 113' is conveyed to the output shaft 109' through the clutch member 108. In this connection, it is to be noted that if the clutch member 108 is fixed at its central portion to the collar 122 slidably operated by the clutch lever 117, the clutch member 108 may have a simple structure wherein the leg portions 108a are sloping continuously without formation of the bent portion 108b. Further, if integral formation of the leg portions 108a as illustrated in FIG. 9 is not desirable, end portions 108a' may be formed as separate members as illustrated in FIG. 10. In this case, a central member 108' has projections 108f and the separate members 108a' have slots 108e for receiving the projections 108f, respectively, so as to be connected to the central member. When the separate members 108a' are employed, the thickness of the material of the clutch member 108 can be increased. The number of the leg portions may be more than three.

Figure 11:
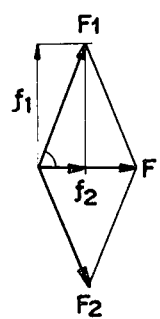
FIG. 11 is an explanatory view, showing operating forces in relation with the clutch member.
Figure 12:
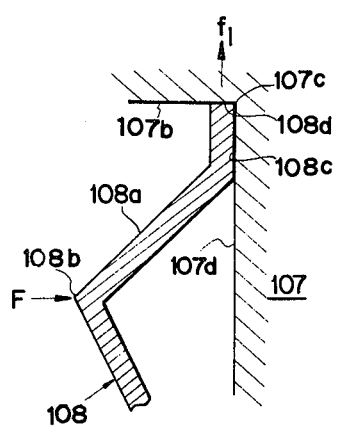
FIG. 12 is an enlarged, fragmentary sectional view illustrating an operation condition of a peripheral portion of the clutch member.

The operation of the clutch mechanism in accordance with the present invention will now be described. As shown in FIGS. 11 and 12, when a pressing force F is applied to the clutch member 108, the leg portions 108a are spread radially so that an operating force $f_1$ as shown in FIG. 11 is obtained. As a result, the peripheral edges 108d of the leg portions 108a abut against the corner portion 107c. The operating force $f_1$ can be obtained accurately and positively by the contacts between the contacting faces 108c of the leg portions 108a and the bottom face 107d of the clutch gear 107 as illustrated in FIG. 12, so that accurate and positive interlocking relation can be established. And yet, when the pressing force F is released, the so established frictional interlocking relation can be released momentarily.

According to the present invention as described above, the recessed portion 107a (See FIG. 9) having the wall and the angular portion 107c is formed on the side of the interlocking rotating member such as a gear 107, and the peripheral edges of the clutch member 108 having a sloping section or preferably a section bent at an intermediate portion thereof are received in the recessed portion 107a, with the peripheral edges 108d directed to the angular portions 108c. The peripheral portion of the respective leg portion 108a has the contacting face 108c adapted to be in contact with the bottom 107d of the recessed portion 107a. On this clutch the member 108 acts the thrust collar, to press and spread the slanting portion. The expanding force in the radial direction and the pressing force exerted between the contacting face 108c and the bottom face 107d are utilized to achieve a markedly effective engaging relation. On the other hand, the engagement is accurately released by releasing the pressing force. The clutch operation of the present embodiment is excellent as compared with that of the conventional clutch mechanism. Moreover, the construction is compact and easily manufactured. Thus, the clutch mechanism can be employed, with advantages, in a pushbutton tuner intended to reduce the thickness thereof.

We claim:

1. A pushbutton tuner comprising;
   a base unit including a baseplate, a plurality of operating members each pivotally supported on the baseplate, and memory slide disposed over the baseplate so as to be displaced by the operating members;
   a coil unit including a plurality of tuning coils, a plurality of cores provided in relation to the corresponding tuning coils, respectively, and a moving member responsive to the displacement of the memory slide for inserting and drawing the cores into and out of the corresponding coils, said coil unit being fitted to said baseplate of the base unit;
   an arm unit including a top plate, a plurality of button sldes each having a push button fitted thereto, respectively, and disposed on the top plate, and a frequency control member provided on each of the button slides and adapted to act on at least one of said operating members upon depression of a push button;

a clutch unit wherein a manual rotating shaft is provided, and the rotation of the rotating shaft is conveyed to the memory slide through the clutch mechanism and the clutch mechanism is opened upon depressing of the button slide, said arm unit and said clutch unit being arranged on the baseplate of the base unit; and a dial pointer mechanism pivotally supported on the top plate of the arm unit, said pointer mechanism being interlocked with the memory slide, said dial pointer mechanism including a T-shaped member, control rods connected to opposite ends of the T-shaped member, respectively, one end of each of said control rods being pivotally connected to the top plate, and one of said rods being interlocked with the memory slide.

2. A pushbutton tuner according to claim 1, which further includes an interlocking link pivotally connected at one end thereof, to said one of the control rods and connected, at another end thereof, to the memory slide, said interlocking link being connected to the T-shaped member through a spring means.

3. A pushbutton tuner according to claim 1, which further comprises a roller fitted to the baseplate and a frame member pivotally supported at its one end and rotatably supported at its another end, said memory slide being provided on the roller, and said clutch mechanism being mounted on the frame member.

4. A pushbutton tuner according to claim 3, which further comprises a resilient member connected to said another end of said frame member for applying resiliency thereto towards the baseplate.

5. A pushbutton tuner according to claim 3, which further comprises a base frame fixed to the baseplate, one end of said frame member is pivotally connected to the base frame.

6. A pushbutton tuner according to claim 3, which further comprises a pivotal shaft having, at its one end, a tapered portion, said frame member being pivotally supported by said base frame through the pivotal shaft.

7. A pushbutton tuner according to claim 1, wherein said clutch mechanism comprises a pair of rotating members, a resilient clutch member interposed between the rotating members, and a main shaft supporting said rotating members and said resilient clutch member thereon, one of said rotating members being interlocked with said manual rotating shaft, the other of said rotating members being interlocked with said memory slide, said rotating members being connected or separated according to the operation of said push button through the resilient clutch member.

8. A pushbutton tuner according to claim 7, wherein one of said rotating members has, on a side thereof, a recessed portion, and a peripheral portion of the resilient clutch member abuts against said recessed portion.

9. A pushbutton tuner according to claim 8, wherein said resilient clutch member is comprised of three leg portions disposed at intervals of 120° and a central portion connecting said leg portions, said leg portions being so disposed that the peripheral portions thereof may abut against said recessed portion and being so formed that they may be bent at respective intermediate portions thereof to provide resiliency.

10. A pushbutton tuner according to claim 7, which further comprises an electromagnetic actuating mechanism provided adjacently to the resilient clutch member and having energizing switch means associated therewith, said switch means being responsive to depressing of said button slide, said actuating mechanism actuating said rotating members to be connected to or separated according to the state of said switch means.

* * * * *